United States Patent
Gonzalez et al.

(10) Patent No.: US 6,822,396 B2
(45) Date of Patent: Nov. 23, 2004

(54) TRANSFORMER IGNITION CIRCUIT FOR A TRANSFORMER COUPLED PLASMA SOURCE

(75) Inventors: Juan Jose Gonzalez, Fort Collins, CO (US); Andrew Shabalin, Fort Collins, CO (US); Steven J. Geissler, Fort Collins, CO (US); Fernando Gustavo Tomasel, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 106 days.

(21) Appl. No.: 10/355,618

(22) Filed: Jan. 31, 2003

(65) Prior Publication Data

US 2004/0160190 A1 Aug. 19, 2004

(51) Int. Cl.[7] .................................................. H01J 7/24
(52) U.S. Cl. ............................ 315/111.51; 315/111.21; 156/345.35; 118/723 IR
(58) Field of Search ....................... 315/111.51, 111.21, 315/111.41, 111.71; 156/345.35, 345.48, 345.49; 118/723 ME, 723 I, 723 IR

(56) References Cited

U.S. PATENT DOCUMENTS

| | | | | | |
|---|---|---|---|---|---|
| 4,431,898 | A | * | 2/1984 | Reinberg et al. | 156/345.35 |
| 5,589,737 | A | * | 12/1996 | Barnes et al. | 315/111.51 |
| 5,717,293 | A | * | 2/1998 | Sellers | 315/111.21 |
| 6,083,344 | A | * | 7/2000 | Hanawa et al. | 156/345.28 |
| 6,432,260 | B1 | * | 8/2002 | Mahoney et al. | 156/345.35 |
| 6,724,148 | B1 | * | 4/2004 | Gonzalez et al. | 315/111.21 |

* cited by examiner

Primary Examiner—Don Wong
Assistant Examiner—Ephrem Alemu
(74) Attorney, Agent, or Firm—Blakely Sokoloff Taylor & Zafman LLP

(57) ABSTRACT

According to one embodiment, an apparatus is described. An apparatus includes a vacuum chamber, an electrical transformer coupled to the vacuum chamber, and an ignition circuit. The electrical transformer induces an electromagnetic field within the vacuum chamber. The transformer includes a primary winding and a magnetic core. In addition, the transformer includes a secondary winding, to which the circuit used to ignite the vacuum chamber is coupled. The ignition circuit is used to establish a controlled capacitive discharge that is used to ignite the vacuum chamber.

21 Claims, 8 Drawing Sheets

TRANSFORMER IGNITION CIRCUIT FOR A TRANSFORMER COUPLED PLASMA SOURCE

FIELD OF THE INVENTION

The present invention relates to the field of remote plasma sources; more particularly, the present invention relates to the ignition of transformer coupled plasma (TCP) sources.

BACKGROUND

Transformer coupled plasmas are routinely used in a number of different applications including materials processing, production of activated gases, pollutant abatement and many others. In such devices, the magnetic core of the excitation transformer is placed in close proximity to, around or within a vacuum chamber. When the primary winding of this transformer is excited with radio frequency (RF), the electromagnetic fields induced around the core sustain a gas plasma discharge within the vacuum apparatus.

One of the main advantages of TCPs is that the power capacitively coupled into the plasma is minimized, resulting in a decrease in chamber wall damage through ion bombardment and, consequently, in extended lifetimes for the plasma chamber. However, this advantage poses a problem for plasma ignition since the capacitive fields are needed to start a plasma discharge.

One of the solutions to this problem has been the introduction of an auxiliary capacitive discharge used to generate enough free charges within the plasma chamber so that an inductively coupled plasma can be established. This additional capacitive discharge is usually driven by an external high voltage circuit.

SUMMARY

According to one embodiment, an apparatus is described. The apparatus includes a vacuum chamber, an electrical transformer coupled to the vacuum chamber, and an ignition circuit. The electrical transformer induces an electromagnetic field within the vacuum chamber. The transformer includes a primary winding and a magnetic core. In addition, the transformer includes a secondary winding, to which the circuit used to ignite the vacuum chamber is coupled. The ignition circuit is used to ignite the vacuum chamber.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

According to one embodiment, a transformer ignition circuit is described. In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
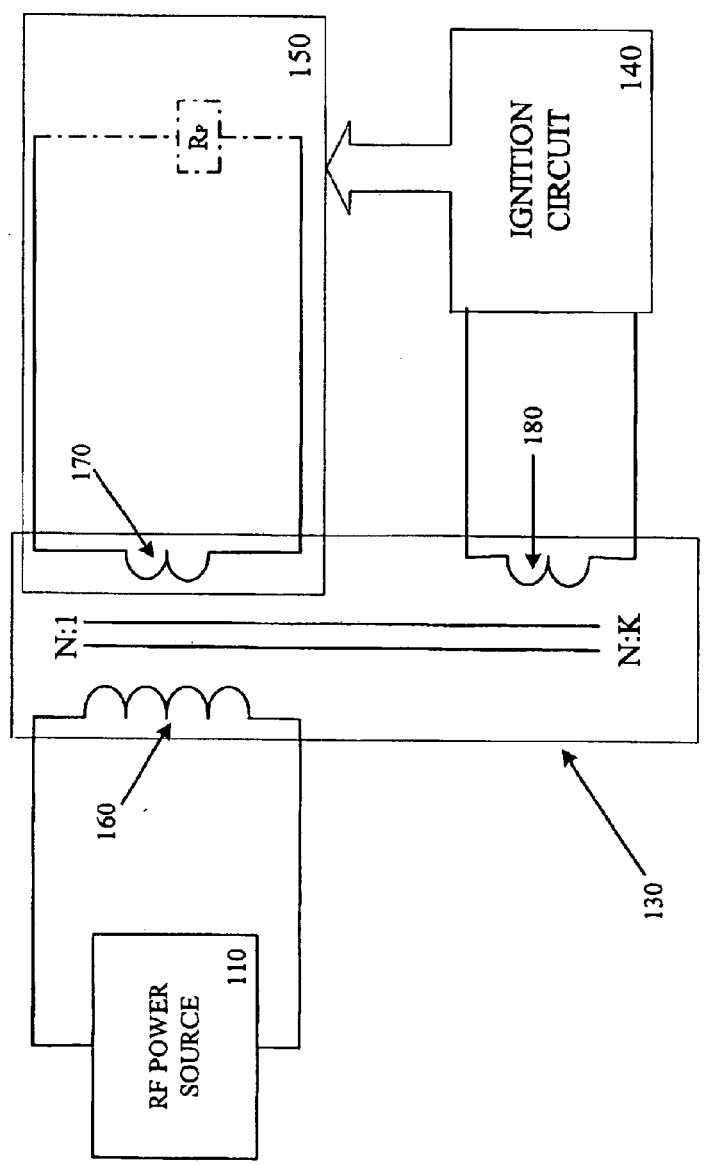
FIG. 1 illustrates one embodiment of a plasma source coupled to an RF power generator.

FIG. 1 illustrates one embodiment of a plasma chamber 150 coupled to an RF power generator 110. In one embodiment, the RF power is coupled to the plasma discharge within the plasma chamber 150 via one or more transformers that utilize at least one magnetic core. Only one transformer 130 is shown here to avoid obscuring the present invention.

The excitation transformer 130 includes the primary winding, which is coupled to the RF power supply 110, and a magnetic core, and the secondary winding 170, which along with the resistance Rp represent the plasma discharge. Note that resistance Rp does not appear until plasma source 130 has been ignited. The transformer 130 also includes a secondary winding 180.

According to one embodiment, an ignition circuit 140 is coupled to plasma chamber 150 and to excitation transformer 130. Ignition circuit 140, driven by secondary winding 180 of one of the excitation transformers of the plasma chamber, produces and controls the ignition of the plasma within the plasma chamber 150.

Figure 2:
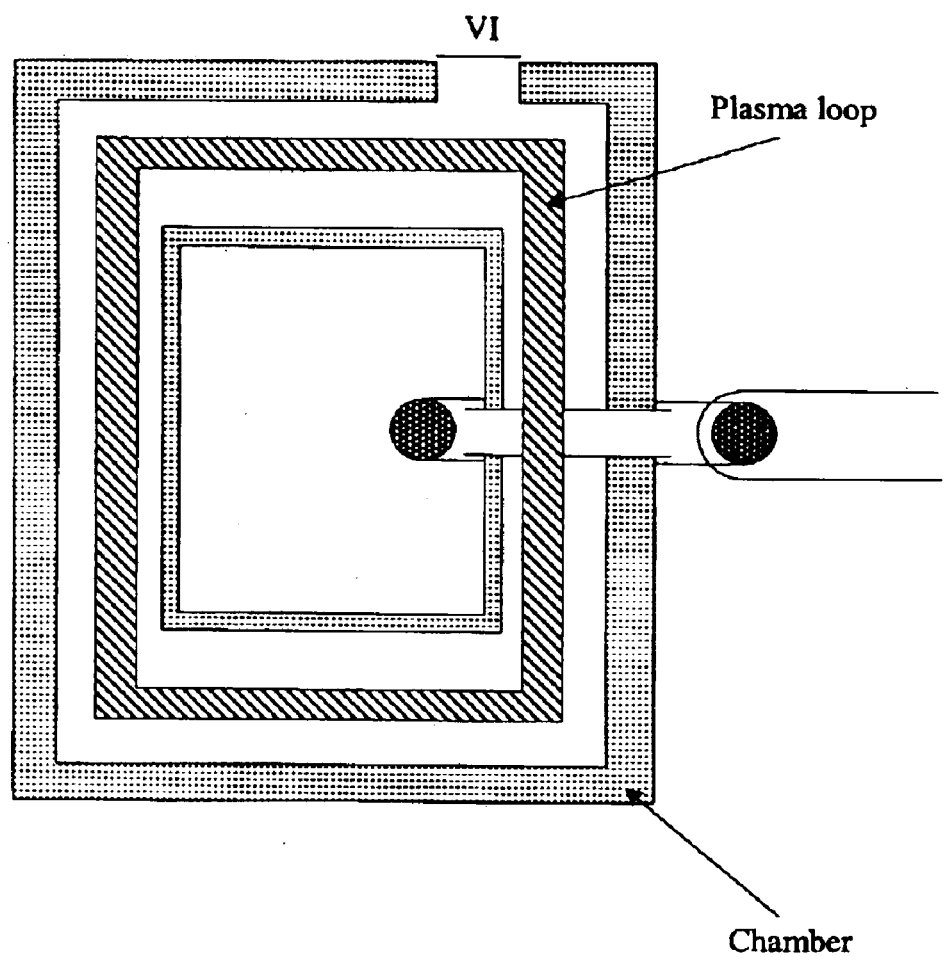
FIG. 2 illustrates an example of a chamber configuration.

FIG. 2 illustrates an exemplary plasma source chamber configuration. The chamber includes a transformer with a primary winding, a magnetic core, and a dielectric break. The chamber also includes an ignition input that receives an ignition voltage $V_I$ in order to ignite the chamber.

The plasma chamber is ignited by an ignition circuit (not shown) that couples power to the plasma source via a capacitive discharge. This discharge generates free charges that are used to establish the inductive plasma discharge. Once established, the inductive discharge performs as a single turn secondary for the transformer.

Figure 3:
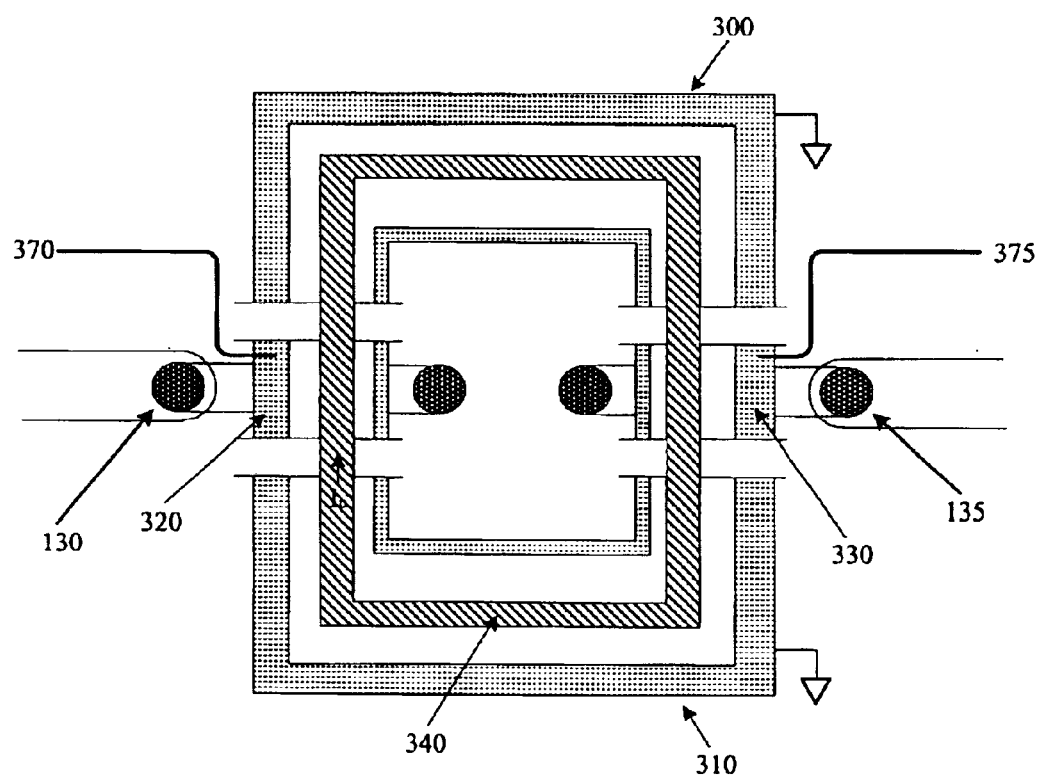
FIG. 3 illustrates one embodiment of a chamber configuration.

FIG. 3 illustrates one embodiment of a plasma chamber 150. The chamber includes four dielectric breaks, excitation transformers 130 and 135, and ignition inputs 370 and 375. Sections 300 and 310 of the plasma chamber are connected to ground. Sections 320 and 330, denominated ignition cores are electrically isolated from ground by the dielectric breaks.

According to one embodiment, the ignition inputs 370 and 375 are connected to ignition cores 320 and 330, respectively. According to another embodiment, the ignition inputs 370 and 375 can be connected to electrodes electrically isolated form the chamber. FIG. 3 also shows the plasma loop 340, which is established within the plasma chamber after the ignition circuit produces enough free charges to initiate the inductively coupled discharge.

Ignition inputs 370 and 375 are used to inject a voltage in order to start chamber 150. The ignition inputs receive a high voltage from an ignition circuit, described below. According to one embodiment, controlled ignition voltage and current are provided at both inputs 370 and 375. The voltage in inputs 370 and 375 can either be applied with respect to ground or be a differential voltage between the inputs.

In the first case, capacitive discharges are established between the ignition cores and the grounded sections of the chamber, whereas in the second case the capacitive discharge is established between the ignition cores. However, in other embodiments, the ignition voltage may be supplied to either of inputs 370 and 375 individually.

FIGS. 4 to 8 illustrate electrical representations of different embodiments of a plasma source with an ignition circuit driven by a secondary winding of the excitation transformer. In all cases, the ignition circuits include one or more switches S that are closed during ignition. As a result, an ignition voltage is applied to ignition input 370 and/or 375 to ignite chamber 150. According to one embodiment, a switch is opened once chamber 150 is ignited. Consequently, the ignition current and voltage applied to chamber 150 are discontinued after the inductively coupled plasma is established.

Figure 4:
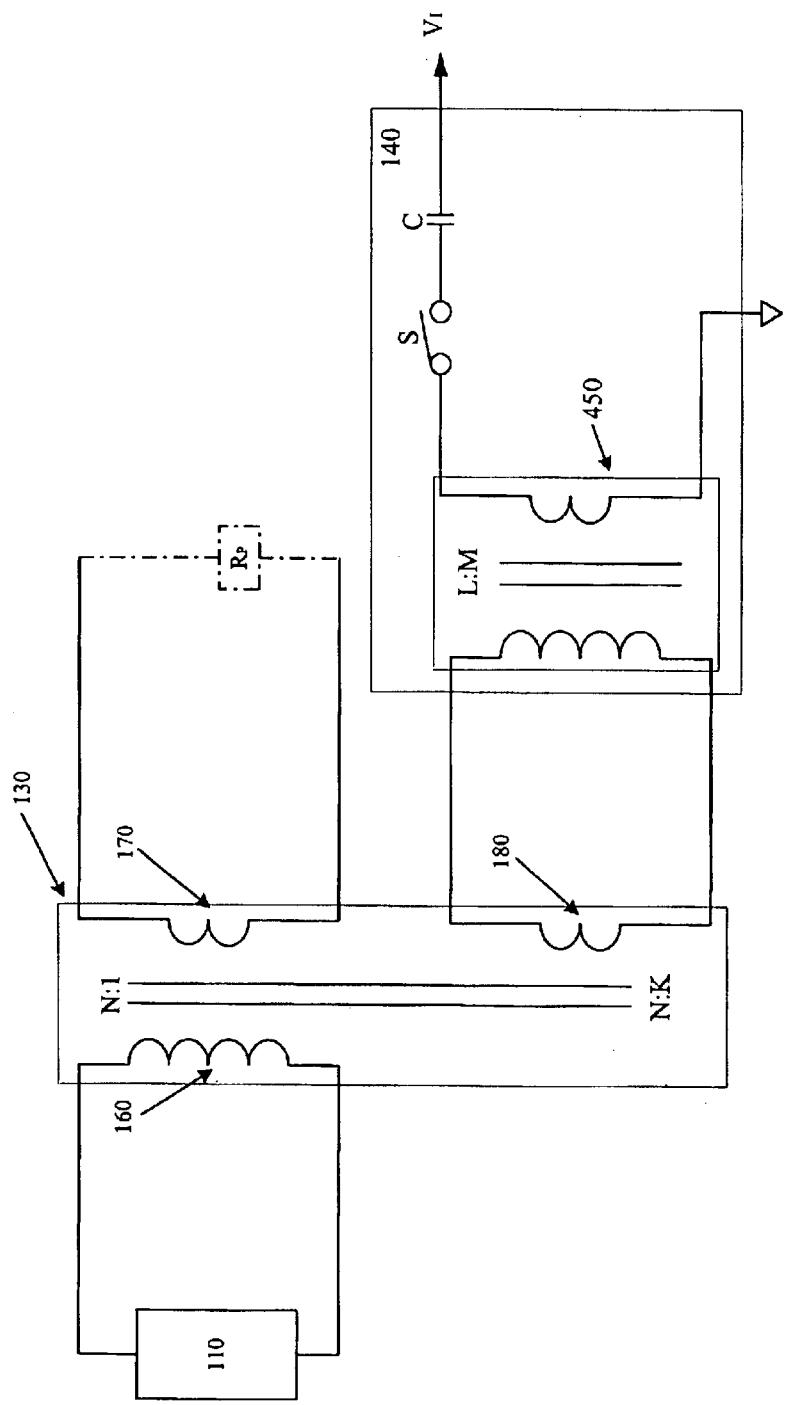
FIG. 4 illustrates an electrical representation of one embodiment of a plasma source, with an ignition circuit, coupled to a RF power generator.

FIG. 4 illustrates an electrical representation of one embodiment of an ignition circuit 140 coupled to excitation transformer 130. Note that only one transformer is shown in order to avoid obscuring the present invention. Ignition circuit 140 includes the primary and secondary windings of transformer 450, a switch (S), and a capacitor (C).

According to one embodiment, whenever a voltage from RF power generator 110 is applied to primary winding 160, the secondary winding 180 generates a floating voltage at the primary of transformer 450. When the switch S is closed, the secondary of transformer 450 provides the ignition voltage $V_I$ through the coupling capacitor C.

Figure 5:
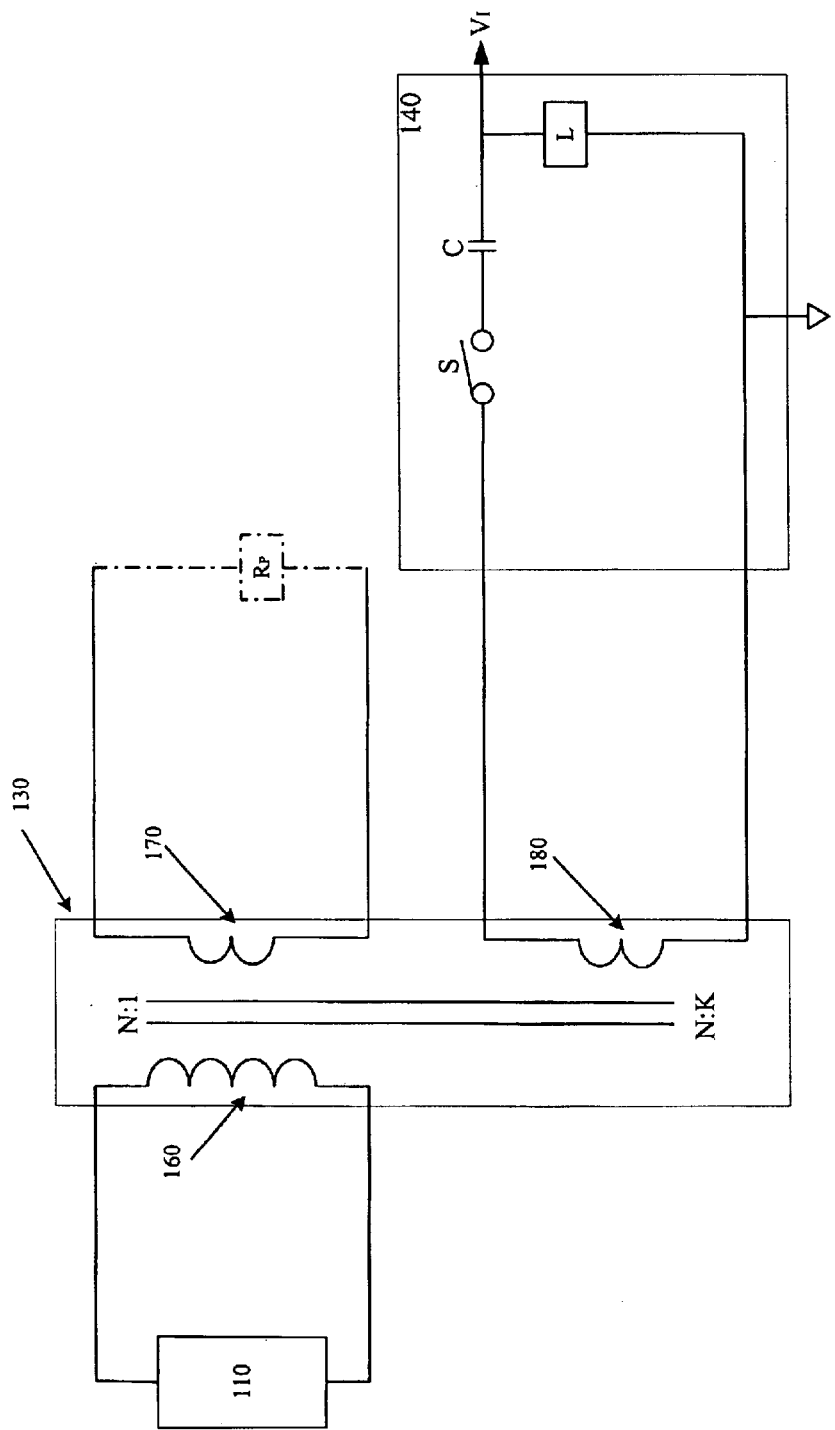
FIG. 5 illustrates an electrical representation of another embodiment of a plasma source, with an ignition circuit, coupled to a RF power generator.

FIG. 5 illustrates an electrical representation of another embodiment of an ignition circuit 140 coupled to excitation transformer 130. In this embodiment, ignition circuit 140 includes a switch S that is coupled directly to secondary winding 180. In addition, a capacitor and inductor are coupled in series with the switch.

Figure 6:
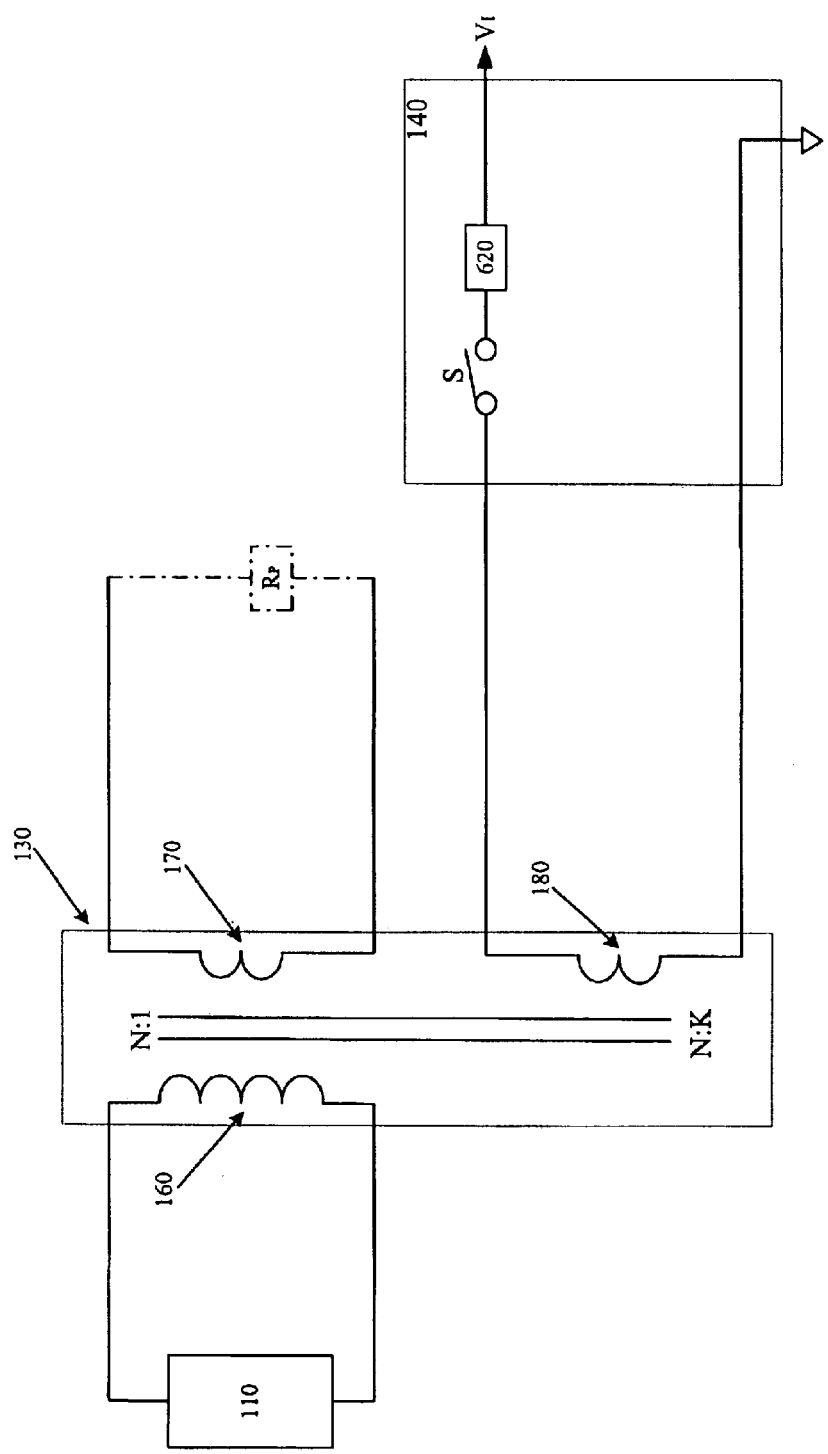
FIG. 6 illustrates an electrical representation of yet another embodiment of a plasma source, with an ignition circuit, coupled to a RF power generator.

FIG. 6 illustrates an electrical representation of another embodiment of an ignition circuit 140 coupled to excitation transformer 130. In this embodiment, ignition circuit 140 includes a switch S coupled to the secondary winding 180 and a ballast 620. Ballast 620 limits the maximum current through ignition circuit 140 so that the winding 180 is not shorted during ignition.

Figure 7:
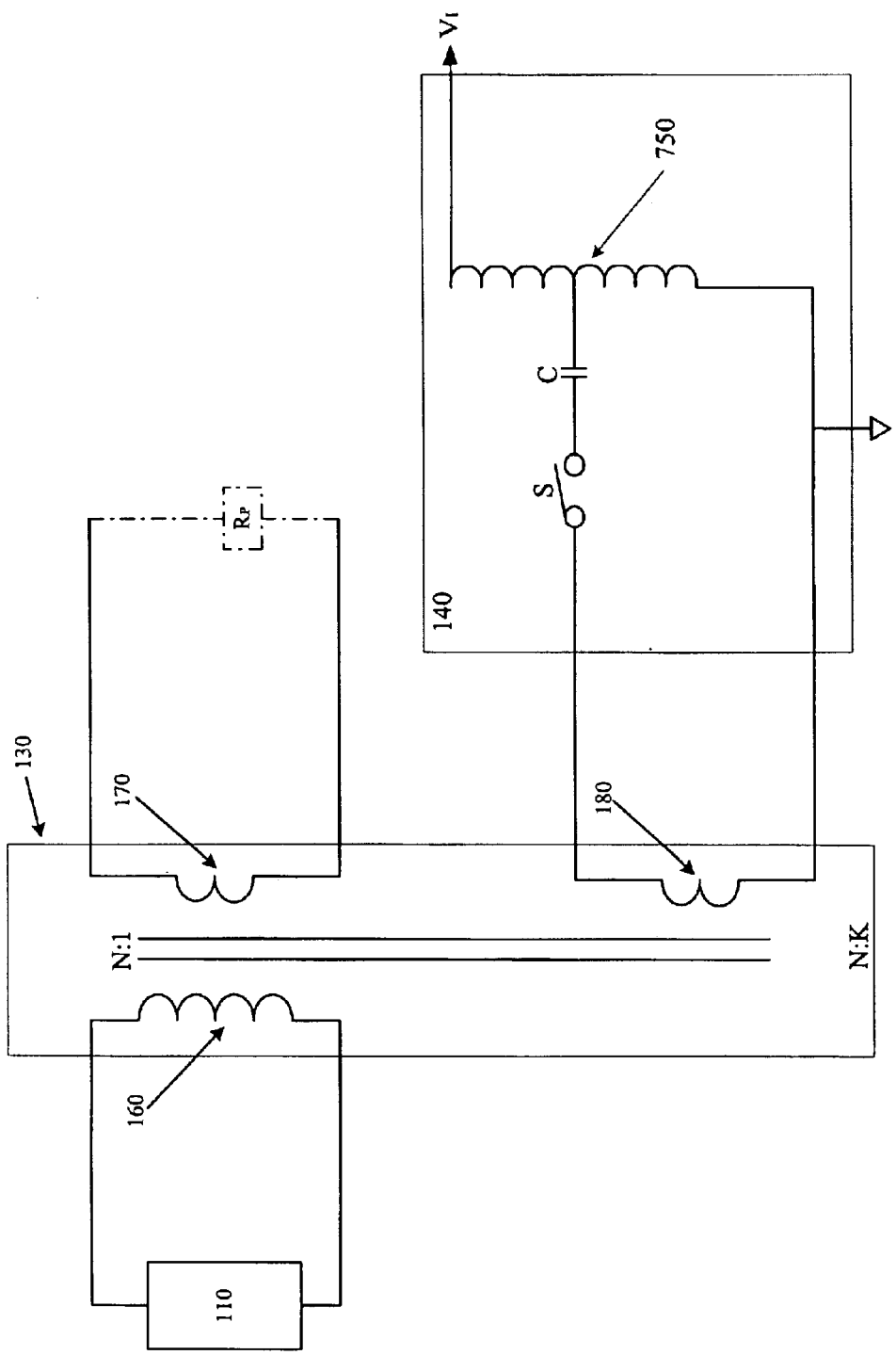
FIG. 7 illustrates an electrical representation of still another embodiment of a plasma source, with an ignition circuit, coupled to a RF power generator.

FIG. 7 illustrates an electrical representation of another embodiment of an ignition circuit 140 coupled to the secondary winding 180 of excitation transformer 130. In this embodiment, ignition circuit 140 includes the switch S, the capacitor C, and an autotransformer 750 coupled to the capacitor. During ignition, when the switch S is closed, the autotransformer 750 generates a voltage that ignites the plasma chamber 150.

Figure 8:
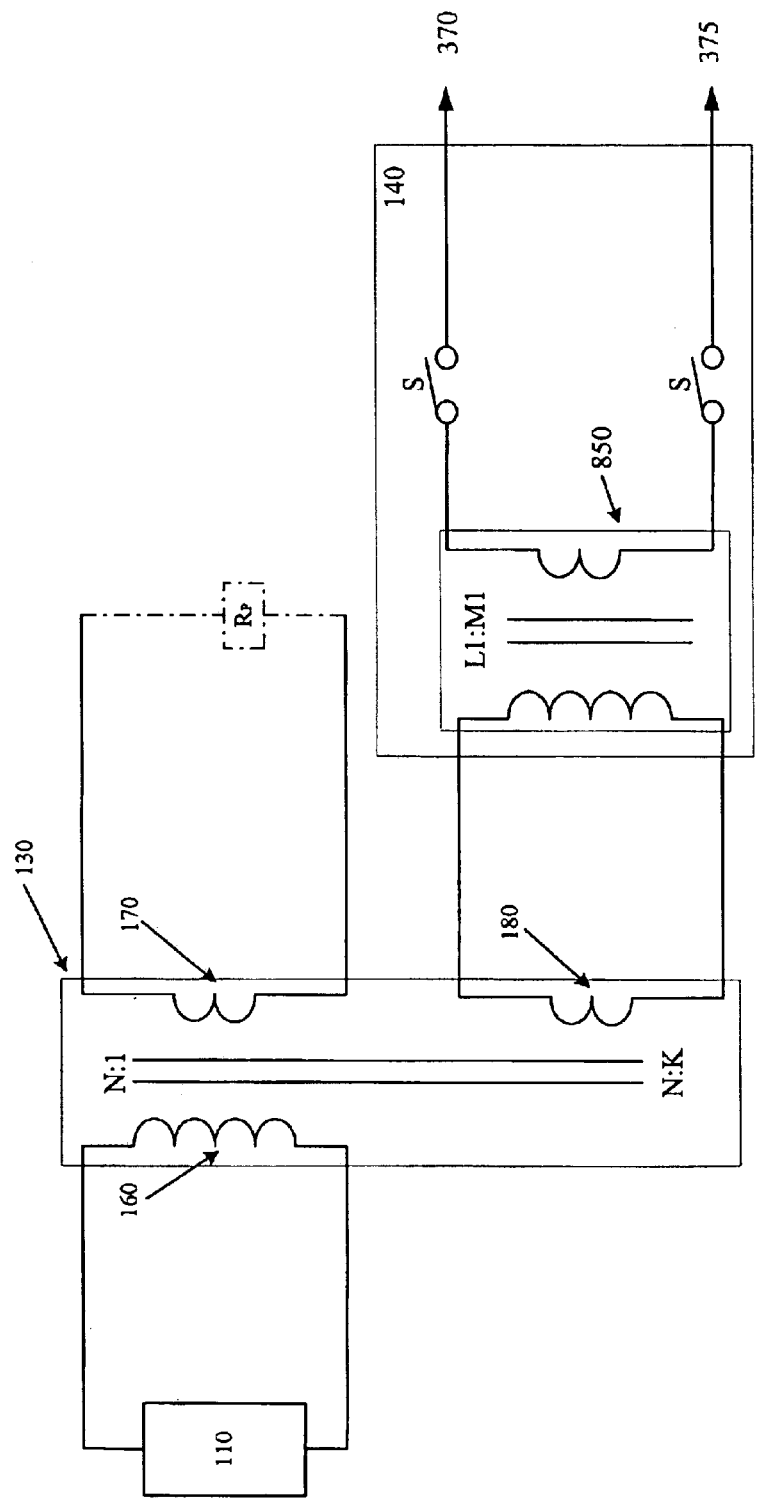
FIG. 8 illustrates an electrical representation of still another embodiment of a plasma source, with an ignition circuit, coupled to a RF power generator.

FIG. 8 illustrates an electrical representation of yet another embodiment of an ignition circuit 140 coupled to excitation transformer 130. In this embodiment, ignition circuit includes the switches S and the transformer 850. The output of transformer 850 is connected to ignition inputs 370 and 375. During ignition, when the switches S are closed, the secondary winding of transformer 850 generates a differential voltage between inputs 370 and 375 that ignites the plasma chamber 150.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

Thus, a mechanism to ignite a transformer coupled plasma chamber has been described.

What is claimed is:

1. An apparatus comprising:
   a vacuum chamber;
   an electrical transformer that surrounds the vacuum chamber to induce an electromagnetic field within the vacuum chamber, the transformer including:
     a primary winding;
     a plasma loop within the chamber that performs as a secondary winding coupled to the vacuum chamber; and
     an auxiliary secondary winding; and
   an ignition circuit coupled to the auxiliary secondary winding to ignite the plasma within the vacuum chamber.

2. The apparatus of claim 1 wherein the ignition circuit comprises a second electrical transformer coupled to the auxiliary secondary winding.

3. The apparatus of claim 2 wherein the ignition circuit further comprises:
   a switch coupled to the a secondary winding of the second electrical transformer; and
   a capacitor coupled to the switch and the secondary winding of the second electrical transformer.

4. The apparatus of claim 3 wherein the switch is closed during the operation of the ignition circuit.

5. The apparatus of claim 4 wherein an ignition voltage is transmitted to the plasma loop within the chamber during the operation of the ignition circuit.

6. The apparatus of claim 5 wherein the vacuum chamber comprises one or more ignition inputs to receive the ignition voltage.

7. The apparatus of claim 5 wherein the switch is opened once the plasma loop within the chamber has been ignited.

8. The apparatus of claim 2 wherein the ignition circuit further comprises:
   a first switch coupled to a first end of the secondary winding of the second electrical transformer; and
   a second switch coupled to a second end of the secondary winding of the second electrical transformer.

9. The apparatus of claim 1 wherein the auxiliary secondary winding is implemented by wrapping a single turn of wire around the metal vacuum chamber.

10. The apparatus of claim 1 wherein the ignition circuit comprises:
    a first end of a switch coupled to a first end of the auxiliary secondary winding;
    a capacitor coupled to a second end of the switch; and
    an inductor coupled to the capacitor and a second end of the auxiliary secondary winding.

11. The apparatus of claim 10 wherein an ignition voltage is transmitted to the plasma loop within the chamber during the operation of the ignition circuit.

12. The apparatus of claim 11 wherein the vacuum chamber comprises one or more ignition inputs to receive the ignition voltage.

13. The apparatus of claim 12 wherein the inductor generates an inductance once the plasma loop within the chamber has been ignited in order to stop the transmission of the ignition voltage.

14. The apparatus of claim 1 wherein the ignition circuit comprises:

a switch coupled to the auxiliary secondary winding; and a balast coupled to the switch.

15. The apparatus of claim 14 wherein an ignition voltage is transmitted to the plasma loop within the chamber during the operation of the ignition circuit.

16. The apparatus of claim 15 wherein the vacuum chamber comprises one or more ignition inputs to receive the ignition voltage.

17. The apparatus of claim 1 further comprising a power supply coupled to the primary winding of the transformer to supply power to the plasma loop within the chamber.

18. The apparatus of claim 17 further comprising an impedance matching circuit coupled between the power supply and the primary winding of the transformer to match the impedance range of the transformer to the output impedance range of the AC power source.

19. The apparatus of claim 1 wherein the ignition circuit comprises:

a first end of a switch coupled to a first end of the auxiliary secondary winding;

a capacitor coupled to a second end of the switch; and an auto transformer coupled to the capacitor and a second end of the auxiliary secondary winding.

20. The apparatus of claim 19 wherein an ignition voltage is transmitted to the plasma loop within the chamber during the operation of the ignition circuit.

21. The apparatus of claim 20 wherein the vacuum chamber comprises one or more ignition inputs to receive the ignition voltage.

* * * * *